(12) United States Patent
White et al.

(10) Patent No.: US 7,803,670 B2
(45) Date of Patent: Sep. 28, 2010

(54) TWISTED DUAL-SUBSTRATE ORIENTATION (DSO) SUBSTRATES

(75) Inventors: Ted R. White, Austin, TX (US); Leo Mathew, Austin, TX (US); Bich-Yen Nguyen, Austin, TX (US); Zhonghai Shi, Austin, TX (US); Voon-Yew Thean, Austin, TX (US); Mariam G. Sadaka, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 532 days.

(21) Appl. No.: 11/458,902

(22) Filed: Jul. 20, 2006

(65) Prior Publication Data

US 2008/0020515 A1 Jan. 24, 2008

(51) Int. Cl.
*H01L 21/00* (2006.01)
(52) U.S. Cl. ............... 438/151; 438/150; 438/156; 438/738; 257/347; 257/349; 257/E31.04; 257/E21.09; 257/E21.123; 257/E21.46
(58) Field of Classification Search ........... 438/150, 438/151, 156, 738; 257/347, 349, E31.04, 257/E21.09, E21.123, E21.46
See application file for complete search history.

(56) References Cited

U.S. PATENT DOCUMENTS

| 5,321,298 | A * | 6/1994 | Moslehi .............. 257/506 |
| 6,635,543 | B2 | 10/2003 | Furukawa et al. .......... 438/311 |
| 6,949,768 | B1 * | 9/2005 | Anderson et al. .......... 257/74 |
| 2005/0275018 | A1 | 12/2005 | Venkatesan et al. ......... 257/347 |
| 2006/0049460 | A1 * | 3/2006 | Chen et al. ................. 257/347 |
| 2007/0099361 | A1 * | 5/2007 | Thean et al. ................ 438/197 |

FOREIGN PATENT DOCUMENTS

WO WO2004/114400 * 12/2004

OTHER PUBLICATIONS

U.S. Appl. No. 11/209,869, filed Aug. 2005, Adetutu et al., 438/199.*
Chang et al., "Extremely Scaled Silicon Nano-CMOS Devices," Nov. 2003, Proceedings of the IEEE vol. 91, No. 11, pp. 1860-1873.*
W.P. Maszara, "Integration Challenges for Double-Gate MOFSET Technologies," MRS Proceedings, vol. 686 (2001).

(Continued)

*Primary Examiner*—Alexander G Ghyka
*Assistant Examiner*—Leonard Chang
(74) *Attorney, Agent, or Firm*—Hamilton & Terrile, LLP; Michael Rocco Cannatti

(57) ABSTRACT

A semiconductor process and apparatus provide a dual or hybrid substrate by forming a second semiconductor layer (214) that is isolated from, and crystallographically rotated with respect to, an underlying first semiconductor layer (212) by a buried insulator layer (213); forming an STI region (218) in the second semiconductor layer (214) and buried insulator layer (213); exposing the first semiconductor layer (212) in a first area (219) of a STI region (218); epitaxially growing a first epitaxial semiconductor layer (220) from the exposed first semiconductor layer (212); and selectively etching the first epitaxial semiconductor layer (220) and the second semiconductor layer (214) to form CMOS FinFET channel regions (e.g., 223) and planar channel regions (e.g., 224) from the first epitaxial semiconductor layer (220) and the second semiconductor layer (214).

19 Claims, 5 Drawing Sheets

OTHER PUBLICATIONS

L. Chang et al., "Extremely Scaled Silicon Nano-CMOS Devices," Proceedings of the IEEE, vol. 91, No. 11, Nov. 2003, pp. 1860-1873.

O. Adetutu et al., "Modified Hybrid Orientation Technology," U.S. Appl. No. 11/209,869, filed Aug. 23, 2005.

B. Doris et al., "A Simplified Hybrid Orientation Technology (SHOT) for High Performance CMOS" 2004 Symposium on VLSI Technology, Digest of Technical Papers, p. 86.

* cited by examiner

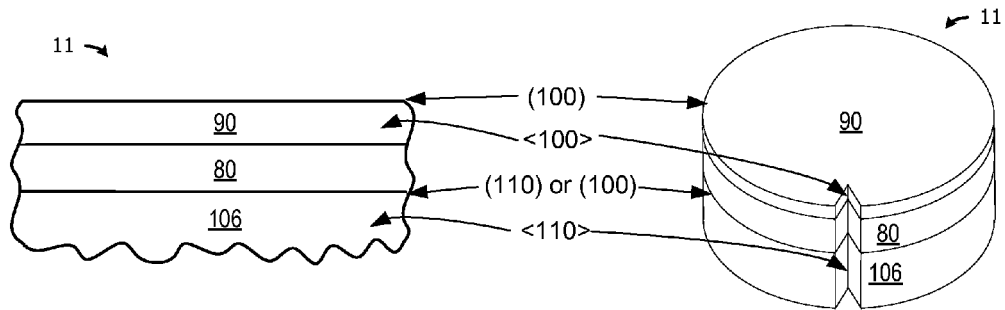
Figure 1(a)
Figure 1(b)
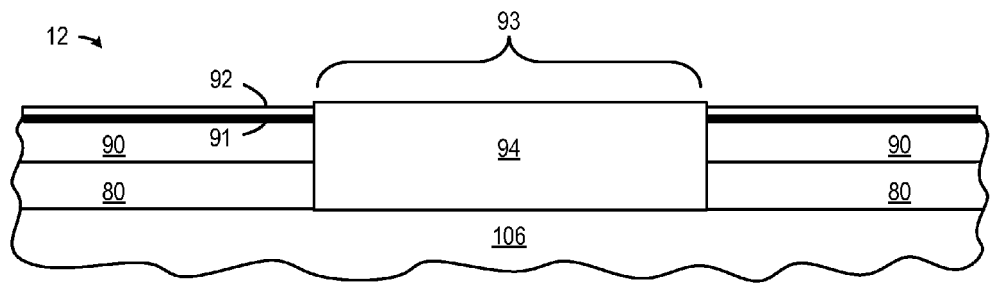
Figure 2
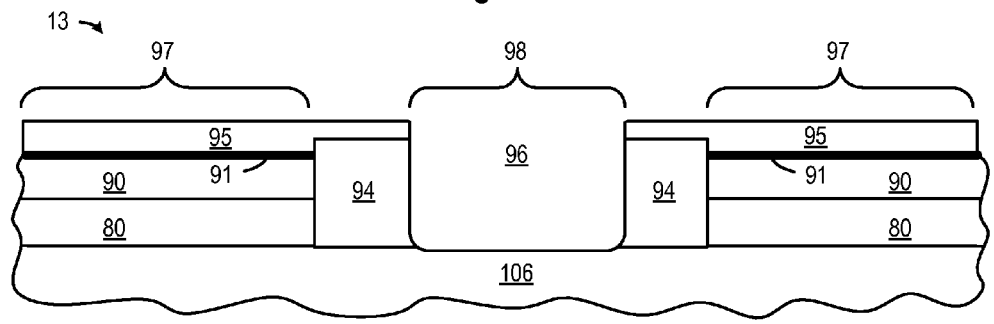
Figure 3
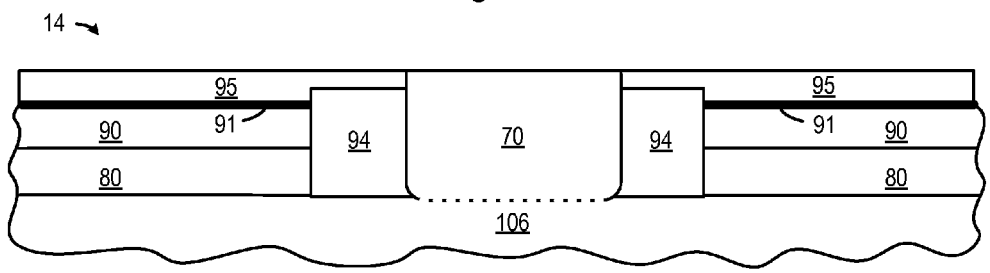
Figure 4

TWISTED DUAL-SUBSTRATE ORIENTATION (DSO) SUBSTRATES

BACKGROUND OF THE INVENTION

1. Field of the Invention

The present invention is directed in general to the field of semiconductor devices. In one aspect, the present invention relates to high-performance complementary metal oxide semiconductor (CMOS) Fin field effect transistors (FinFETs) fabricated on hybrid or dual orientation substrates.

2. Description of the Related Art

Prior attempts to address the difference in electron and hole mobility values for NMOS and PMOS FinFET devices formed on the surface of semiconductor wafers having a single crystal orientation have aligned the channels of the NMOS FinFETs at a 45 degree angle with respect to the channels of the PMOS FinFETs. See, for example, L. Chang et al., "Extremely Scaled Silicon Nano-CMOS Devices," *Proceedings of the IEEE*, Vol. 91, No. 11, pp. 1860-1873 (November 2003). Such an alignment occupies more area, is difficult to pattern with advanced lithography techniques and is not readily integrated with planar, single gate CMOS devices.

Accordingly, a need exists for a semiconductor manufacturing process which creates CMOS devices that take advantage of the differing surface orientation dependencies for electron and hole mobilities. There is also a need for a FinFET manufacturing process which can be readily integrated with planar CMOS FETs on a single substrate. There is also a need for a fabrication process which avoids the process and performance limitations associated with non-aligned surface device features. In addition, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which:

FIGS. 1(a) and (b) are partial cross-sectional and three-dimensional views of a semiconductor wafer structure on which SOI layers are formed over a semiconductor substrate;

FIG. 2 illustrates processing subsequent to FIGS. 1(a) and (b) where portions of the first oxide layer, the first nitride layer and the SOI layers have been removed and replaced with a deposited and polished insulator or oxide layer;

FIG. 3 illustrates processing subsequent to FIG. 2 after the first nitride layer is removed and a second nitride layer is formed over the wafer structure, and portions of the second nitride layer and deposited oxide layer have been etched or removed to form an opening;

FIG. 4 illustrates processing subsequent to FIG. 3 after an epitaxial semiconductor layer is selectively formed to partially or completely fill the opening;

Figure 5:
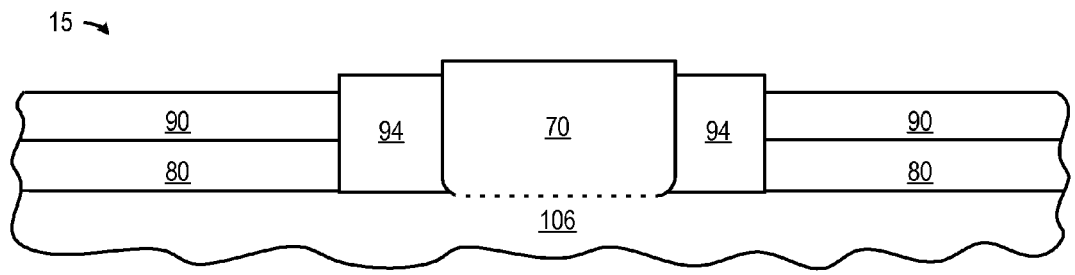
FIG. 5 illustrates processing subsequent to FIG. 4 after the second nitride layer and first oxide layer have been stripped.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating high performance CMOS FinFET devices with hybrid or dual substrates by selectively growing epitaxial semiconductor to partially or completely fill a trench opening formed in a shallow trench isolation region, thereby forming a first substrate (e.g., an epitaxial semiconductor layer) that is isolated by the shallow trench isolation region from a second substrate (e.g., an SOI semiconductor layer). After selectively etching part of the shallow trench isolation region down to a buried SOI insulator layer, the first substrate (epitaxial semiconductor layer) and second substrate (SOI semiconductor layer) are patterned and etched to form the channel or body portions of FinFET transistor devices over first and second substrates. By separately forming the first and second substrates with different, rotated crystal orientations prior to the pattern and etch steps, FinFETs and/or other planar devices having an improved performance can be fabricated in an area-efficient manner. For example, the crystal orientation of the second substrate (used to make NMOS devices) can be twisted or rotated 45 degrees with respect to the crystal orientation of the first substrate (used to make PMOS devices), resulting in FinFET devices that exploit the different surface orientation dependencies for electron and hole mobility.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Turning now to FIGS. 1(a) and (b), a partial cross-sectional view and three-dimensional view are illustrated of a semiconductor wafer structure 11 on which semiconductor-on-insulator (SOI) layers 80, 90 are formed over a semiconductor substrate layer 106. Specifically, the structure 11 includes a first semiconductor layer 106 formed of a semiconductor material that has a first crystallographic orientation. Depending on the type of transistor device being fabricated, the first semiconductor layer 106 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group VI and/or III-IV and/or II-VI compound semiconductors or any combination thereof, and may optionally be formed as the bulk handling wafer. As will be appreciated, the semiconductor layer 106 may be appropriately doped to provide n-type (electron) and p-type (hole) carriers. The crystallographic orientation of the first semiconductor layer 106 may be (110), (111), or (100).

In the SOI layers, the structure 11 includes an insulator layer 80 formed on the first semiconductor layer 106 which will ultimately be used to form the buried oxide (BOX) layer for semiconductor-on-insulator devices. The thickness of the insulator layer 80 should be sufficiently thick to electrically isolate the first semiconductor layer 106 from the second semiconductor layer 90, and in a selected illustrative embodiment, is approximately between 1400-1500 Angstroms thick. In addition, the SOI layers include a second semiconductor layer 90 having a predetermined thickness (e.g., approximately between 10-1000 Angstroms thick) and formed of a semiconductor material which has a second crystallographic orientation which is different from the first crystallographic orientation. Depending on the type of transistor device being fabricated, the second semiconductor layer 90 may be formed from any semiconductor material, including, for example, Si, SiC, SiGe, SiGeC, Ge, GaAs, InAs, InP as well as other VI and/or III-IV and/or II-VI compound semiconductors or any combination thereof. It will also be appreciated that the second semiconductor layer 90 may be appropriately doped to provide n-type (electron) and p-type (hole) carriers. In a selected embodiment, the wafer 11 can be fabricated so that the crystal orientation of the second semiconductor layer 90 is twisted or rotated 45 degrees with respect to the crystal orientation of the first semiconductor layer. For example, the crystallographic orientation of the second semiconductor layer 90 may be (100), (111), or (110), so long as the crystallographic orientation of the second semiconductor layer 90 differs from the crystallographic orientation of the first semiconductor layer 106. In addition, the second semiconductor layer 90 may have a (100) top surface orientation and a <100> channel direction in the notch 60, while the first semiconductor layer 106 may have a (100) or (110) top surface orientation and a <110> channel direction in the notch 60. The crystal orientations of the first semiconductor layer 106 and the second semiconductor layer 90 will depend on the materials used to form the wafer structure 11. For example, when silicon is employed as the semiconductor material, electron mobility is higher on a (100) surface orientation, and hole mobility is higher on a (110) surface orientation, provided that the channel direction is oriented in the <110> direction. In this case, the (100) Si surface is used as the substrate layer for NMOS devices, while the (110) Si surface is used to form the substrate layer for PMOS devices, as described below.

FIG. 2 illustrates processing of a semiconductor wafer structure 12 subsequent to FIGS. 1(a) and (b) after a first oxide layer 91 is formed on the second semiconductor layer 90, followed by deposition of a nitride layer 92. Subsequently, portions of the first nitride layer 92, the first oxide layer 91, and the SOI layers 80, 90 are removed and replaced with a deposited and polished oxide layer 94. In particular, after forming the first oxide layer 91 and nitride layer 92, a mask layer (not shown) may optionally be formed on an exposed upper surface of the nitride layer 92. Using the oxide layer 91 and nitride layer 92 (and optional mask layer), conventional patterning and anisotropic etching techniques may be used to form an opening 93 through the second semiconductor layer 90 and buried oxide layer 80. In this opening 93, an oxide layer 94 is formed to replace the SOI layers 80, 90 in the opening 93 by depositing an overlying layer of oxide and then polishing the oxide back substantially to level with the mask layer 92 (as shown in FIG. 2) or back to the level of the second semiconductor layer 90 (not shown). While the deposited dielectric layer 94 may be formed with any desired dielectric material, a high density plasma oxide is deposited in accordance with a selected embodiment.

FIG. 3 illustrates processing of a semiconductor wafer structure 13 subsequent to FIG. 2 after the first nitride layer 92 is removed and a mask layer (e.g., a second nitride layer) 95 is formed over the wafer structure, and then portions of the second nitride layer 95 and deposited oxide layer 94 have been etched or removed by patterning and etching to form a second etch opening 96 to the exposed first semiconductor layer 106. The pattern transfer and etching of the mask layer may use one or more etching steps to selectively remove the unprotected portions of the oxide layers 94, including a dry etching process such as reactive-ion etching, ion beam etching, plasma etching or laser etching, a wet etching process wherein a chemical etchant is employed or any combination thereof.

The opening 96 is used to define and differentiate active regions for first and second types of MOS devices subsequently formed on the wafer structure 13. For example, the unetched portions of the second semiconductor layer 90 define a first circuit area or device region 97 for a first type of MOS device, while the portions of the first semiconductor layer 106 that is exposed by the opening 96 (and that is subsequently epitaxially regrown, as described hereinbelow) defines a second circuit area or device region 98 for a second type of MOS device. To this end, at least part of the unetched portions of the oxide layer 94 may be used to form at least part of the shallow trench isolation regions for electrically and physically isolating the first and second device regions from one another by designing the width and placement of the second etch opening 96 to be smaller than the width of the first etch opening 93, and contained within the first etch opening 93.

At this stage of manufacture, well-regions (not shown) may be formed in the exposed portions of the first semiconductor layer 106 by selectively implanting dopants using the upper nitride layer 95 as an implant mask. For example, well regions may be formed by implanting impurities (e.g., arsenic or phosphorous or boron) with an implant energy of approximately 10-1000 keV and a dosage of approximately 1×1011 to 1×1014 cm−2, though other implant energies and dosages may be used.

Turning now to FIG. 4, processing of a semiconductor wafer structure 14 subsequent to FIG. 3 is illustrated to show formation of a selective epitaxial silicon layer 70 to partially or completely fill the opening 96 so that it is higher than the second semiconductor layer 90 and/or the mask layer 95. As described herein and understood by those skilled in the art, the process of forming an epitaxial layer may be described as either depositing or growing a layer so that the "growth" and "deposition" terms are used interchangeably in this respect, though "growth" is a more descriptive term for epitaxy. By selectively forming the semiconductor layer 70 so that its crystallographic orientation is different from the crystallographic orientation of the second semiconductor layer 90, the mobility of the holes and electrons for subsequently formed PMOS and NMOS devices, respectively, may be optimized. Since the regrown semiconductor layer 70 is epitaxially grown from the first semiconductor layer 106, they will have the same crystallographic orientations (as indicated by the dashed line between regions 106 and 70), though the layers 70, 106 can be formed of different semiconductor materials. Depending on the type of transistor device being fabricated, the semiconductor layer 70 may be formed from any (doped or undoped) semiconductor material, such as Si, SiGe, SiC, SiGeC or combinations thereof, which is capable of being formed utilizing a selective epitaxial growth method. Selected embodiments of the present invention also contemplate using strained or compressed materials to further enhance mobility. For example, if PMOS devices are formed over the semiconductor layer 70, the semiconductor layer 70 may be formed by epitaxially growing silicon having a crystallographic orientation (e.g., (110)) that is the same as the crystallographic orientation of the first semiconductor layer 106. This epitaxial growth may be achieved by heating the semiconductor wafer structure 13 to a temperature between 500 and 900° C. in the presence of dichlorosilane, HCl and hydrogen gas. Alternatively, if NMOS devices are formed over the semiconductor layer 70, at least a portion of the epitaxially grown layer 70 may be formed by epitaxially growing silicon having a (100) crystallographic orientation. In this case, the second semiconductor layer would have a (110) crystallographic orientation, and the PMOS device would be built on this layer. By optimizing the crystallographic orientations of the layers 70, 106 (e.g., so that the epitaxially grown layer 70, or "epi-layer," is formed of (110) semiconductor material and the second semiconductor layer 90 is formed of (100) semiconductor material), significant mobility improvements are obtained over single-orientation substrates—up to 2.5× improvement for hole mobility in PMOS devices. In addition, by completely filling the trench opening 96 with an epitaxial semiconductor layer 70 that grows above and over the nitride mask layer 95, crystalline defectivity in the trench opening 96 is reduced or minimized. It will be appreciated that, when the epi layer 70 is formed with n-type material, the second semiconductor layer 90 in the SOI region may be formed of depositing strained p-type semiconductor material having a second crystal orientation that is different from the first crystal orientation. In a selected embodiment, semiconductor layers initially have only a small dopant concentration. Their dopant concentrations and types are established later with well layer 70 and body layer 90 implants.

FIG. 5 illustrates processing of a semiconductor wafer structure 15 subsequent to FIG. 4 after the second nitride layer 95 and first oxide layer 91 have been stripped. As for the removal of mask and oxide layers 95, 91, any desired stripping process may be used that is capable of selectively removing the patterned mask and oxide layers 95, 91 from the structure 15, including but not limited to, one or more wet etching processes wherein a chemical etchant is employed to remove the nitride layer 95 and oxide layer 91. As a result, the SOI semiconductor layer 90, polished oxide layer 94 and epitaxial semiconductor layer 70 are cleared of any masking and/or pad oxide layers.

Figure 6:
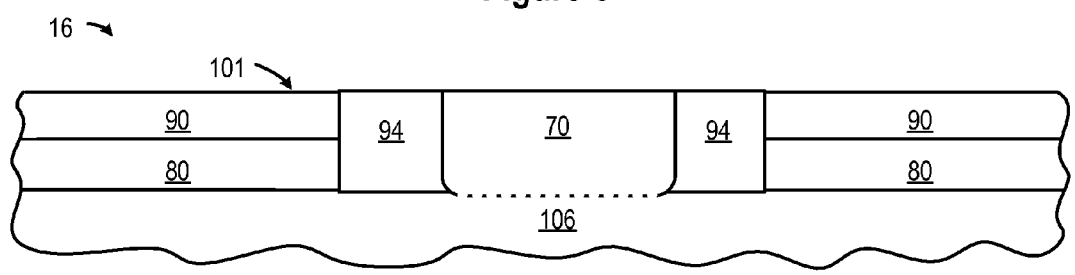
FIG. 6 illustrates processing subsequent to FIG. 5 after CMP polishing of the epitaxial semiconductor layer, deposited oxide layer and SOI semiconductor layer.

FIG. 6 illustrates processing of a semiconductor wafer structure 16 subsequent to FIG. 5 after a chemical mechanical polishing (CMP) and/or any desired etchant or stripping process is used to polish and/or planarize the epitaxial semiconductor layer 70, deposited oxide layer 94 and SOI semiconductor layer 90. As a result, a dual substrate structure having a substantially coplanar surface 101 is obtained by polishing and/or etching the epi semiconductor layers 70 back to the same level as the second semiconductor layer 90. Of course, the epi semiconductor layers 70 may be polished or etched back to a lesser or greater extent, but in any case is substantially coplanar with the second semiconductor layer 90 to facilitate CMOS processing.

Figure 7:
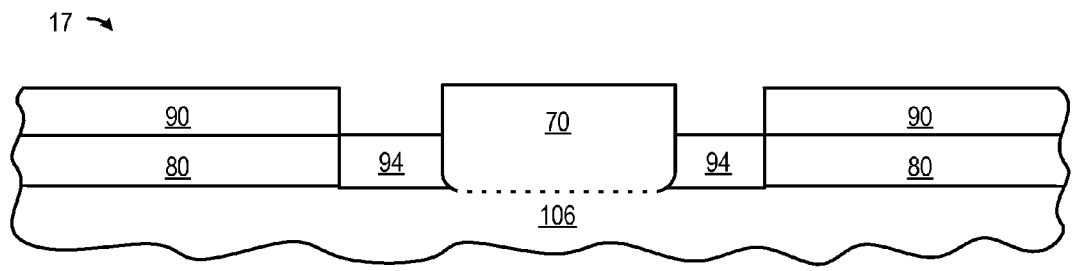
FIG. 7 illustrates processing subsequent to FIG. 6 after the remaining deposited oxide layer is at least partially etched or removed.

FIG. 7 illustrates processing of a semiconductor wafer structure 17 subsequent to FIG. 6 after the remaining deposited oxide layer 94 is at least partially etched or removed, though the entirety of the oxide layer 94 may be removed. Any desired etchant process may be used that is capable of selectively removing the oxide layers 94 from the structure 17 in a controlled way. As illustrated, the deposited oxide layer 94 is etched down to the buried SOI insulator layer 80, preferably by using an etch chemistry that is selective to the semiconductor material used to form the epitaxial semiconductor layer 70 and SOI semiconductor layer 90. However, it will be appreciated that other techniques can be used to avoid using a controlled etch process to selectively remove the oxide layer 94. For example, instead of filling the opening 93 with a polished oxide layer 94 (as shown in FIG. 2), the opening 93 may instead be filled by sequentially forming layers of oxide (e.g., with an oxide growth process), nitride (e.g., with a selective deposition process) and oxide (e.g., with a blanket deposition process) to appropriate thicknesses so that the etch process depicted in FIG. 7 etches through the upper oxide layer, but stops or slows at the middle nitride layer (not shown). Alternatively, a standard STI process could be used in place of forming and etching the oxide layer 94, such as by etching the opening 93 only down to (but not through) the buried insulator layer 80 prior to depositing and polishing an insulator layer in the opening 93 (not shown). With the dual insulator layers formed in the region of opening 93, the etch process depicted in FIG. 7 will etch more quickly through the softer upper insulator layer, but will be slowed to a more controllable etch as the buried insulator layer 80 is exposed. However formed, the remaining, unetched portion of the polished first oxide layer 94 helps provide electrical and physical isolation between transistor devices formed on the SOI semiconductor layer 90, on the one hand, and the transistor devices formed on epitaxial semiconductor layer 70, on the other hand. As a result of the foregoing steps, a first substrate is formed from the epitaxial semiconductor layer 70 and a second substrate is formed from the SOI semiconductor layer 90.

Figure 8:
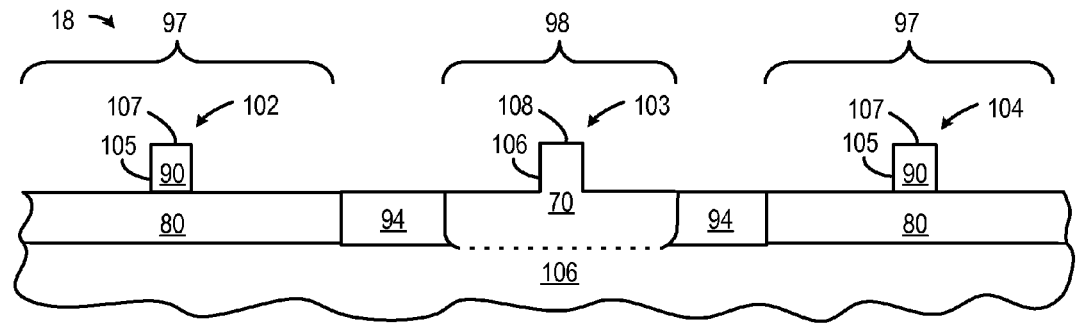
FIG. 8 illustrates processing subsequent to FIG. 7 after the SOI semiconductor layer and epitaxial semiconductor layers are selectively etched to form the channel or body portions of FinFET transistor devices in the first and second substrates.

FIG. 8 illustrates processing of a semiconductor wafer structure 18 subsequent to FIG. 7 after the SOI semiconductor layer 90 and epitaxial semiconductor layer 70 are selectively etched to form the channel or body portions 102-104 of FinFET transistor devices in the first and second substrates 90, 70. As will be appreciated, the illustration of FIG. 8 depicts a particular cross-section of the semiconductor structure 18 where the channel or body portions of FinFET transistor devices are located, and does not depict other device features. For example, the source and drain regions that are also formed from the SOI semiconductor layer 90 "in front of" and "behind" the depicted cross section are not depicted in FIG. 8, but are described below.

As will be appreciated, any desired patterning and etching techniques may be used to remove a portion of the second semiconductor layers 90, thereby forming the channel or body portions 102, 104 of the FinFET transistor devices in the first device region 97. The pattern and etch process may also be used to form the channel or body portions 103 of the FinFET transistor devices in the second device region 98 by removing a portion of the first epitaxial semiconductor layer 70. By virtue of controlling the initial formation of the semiconductor substrate layers 90, 70, the crystal orientations of the vertical and horizontal surfaces of the body regions 102-104 may be controlled. For example, in a selected embodiment, the body region 103 formed from the first epitaxial semiconductor layer 70 has a channel direction of <110>, a vertical sidewall surface 106 with a (100) orientation, and has a horizontal top surface 108 with either a (110) or (100) orientation. In addition, the body regions 102, 104 formed from the second semiconductor layer 90 have a channel direction of <100>, vertical sidewall surface 105 with a (100) orientation, and have a horizontal top surface 107 with a (100) orientation. In this example, the body regions 103 may be used to fabricate PMOS FinFET devices in the second device region 98, while the body regions 102, 104 may be used to fabricate NMOS FinFET devices in the first device region 97.

Figure 9:
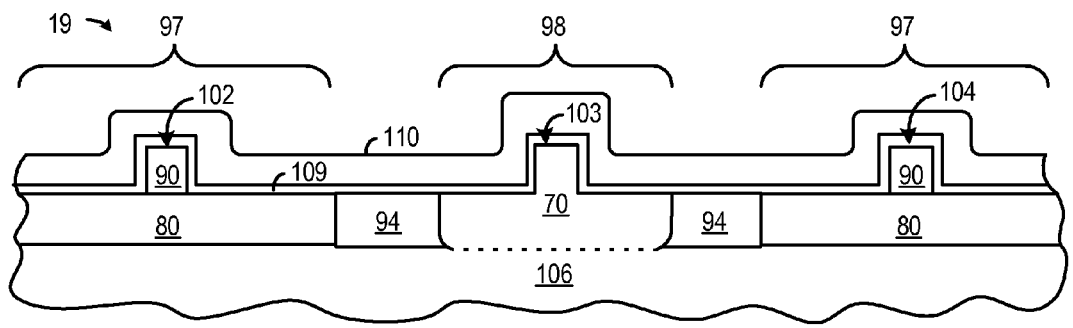
FIG. 9 illustrates processing subsequent to FIG. 8 after a conductive gate layer is formed over the channel or body portions of FinFET transistor devices.

FIG. 9 illustrates processing of a semiconductor wafer structure 19 subsequent to FIG. 8 after an insulator layer 109 is selectively formed in the first and second device regions, followed by formation of a conductive gate layer 110 over the channel or body portions 102-104 of FinFET transistor devices 102-104. A simplified representation of the insulator layer 109 is shown which may be formed with any desired insulator formation process(es). As for the conductive gate layer 110, it may be formed by depositing or forming a first conductive material (e.g., polysilicon, SiGe and/or a metallic layer) having a thickness in the range of 1-200 nanometers over the wafer structure 19 to cover the exposed oxide layers 80, 94, 109 and the body portions 102-104 of FinFET transistor devices. Though not shown in FIG. 9, the conductive layer 110 may also cover other regions of the first epitaxial semiconductor layer 70 and second semiconductor layer 90 where gate electrodes are formed for the FinFET and planar MOSFET transistor devices. Subsequently, any desired gate pattern and etch processing steps may be used to form the desired etched gates over the FinFET body portions 102-104.

Figure 10:
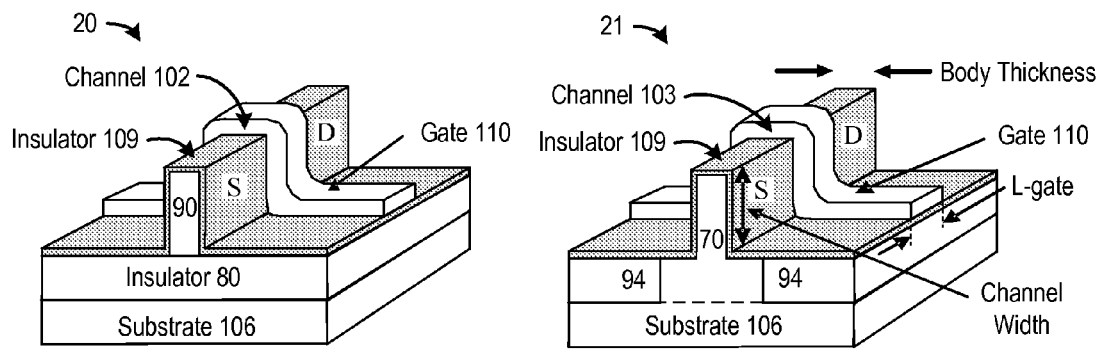
FIG. 10 illustrates processing subsequent to FIG. 9 with perspective views of the bulk and SOI FinFET devices after selective removal of the conductive gate layer.

The result of the gate etch process is illustrated in FIG. 10, which depicts perspective views of the SOI FinFET devices 20 and bulk devices 21 formed after selective removal of the conductive gate layer 110. In particular, the SOI FinFET device 20 illustrates a FinFET transistor formed in the first circuit area or device region 97. The FinFET device 20 is formed over and insulated from a substrate 106 (e.g., the first semiconductor layer) by one or more insulator layers 80, 109, and includes a channel 102 formed from a semiconductor layer 90 that connects source and drain regions and that is covered on the top and sides by a gate layer 110. As for the bulk FinFET device 21 formed in the second circuit area or device region 98, it is formed over and connected to a substrate 70 (e.g., the first epitaxial semiconductor layer), and includes a channel 103 formed from a semiconductor layer 70 that connects source and drain regions and that is covered on the top and sides by a gate layer 110. A body tie (not shown) to fin 70 can be provided through substrate 70. Each channel 102, 103 is defined by body thickness and channel width dimensions, while the gate layer 100 is defined by a gate length (L-gate) dimension. In a selected embodiment, these dimensions may be separately controlled for the FinFET devices in the first and second device regions 97, 98. For example, by controlling the relative heights of the first epitaxial semiconductor layer 70 and second semiconductor layer 90, FinFETs can be fabricated having channel regions with different heights or channel widths.

In addition to forming CMOS FinFET devices using a combination of bulk and SOI FinFET devices, the twisted dual substrate orientation techniques disclosed herein may be used to fabricate double SOI substrates on which are formed planar and FinFET CMOS devices. An example of such an application is depicted beginning with FIG. 11 which depicts a partial cross-sectional view of a semiconductor wafer structure 201 that includes a semiconductor handle wafer 210, first SOI layers 211, 212 formed on the handle wafer 210, second SOI layers 213, 214 formed on the first SOI layers, and a first oxide layer 215 and nitride layer 216 formed on the second SOI layers. In the fully SOI example described herein, the semiconductor handle wafer 210 may be formed from any desired substrate material having any desired crystallographic orientation.

In the first SOI layers 211, 212, the structure 201 includes a first SOI insulator layer 211 formed on the semiconductor handle wafer 210 and having a predetermined thickness (e.g., between approximately 1400-1500 Angstroms). In addition, the first SOI layers include a first SOI semiconductor layer 212 having a predetermined thickness (e.g., approximately between 500-800 Angstroms thick) that is formed of any desired semiconductor material (e.g., any Group VI and/or III-IV and/or II-VI compound semiconductors) having a first crystallographic orientation. As for the second SOI layers 213, 214, the second SOI insulator layer 213 is formed on the first SOI semiconductor layer 212, and the second SOI semiconductor layer 214 is formed on the second SOI insulator layer 213 from any desired semiconductor material (e.g., any Group VI and/or III-IV and/or II-VI compound semiconductors) having a second crystallographic orientation which is different from the first crystallographic orientation. In a selected embodiment, the wafer 201 is fabricated so that the crystal orientation of the second SOI semiconductor layer 214 is twisted or rotated 45 degrees with respect to the crystal orientation of the first SOI semiconductor layer 212. For example, the crystallographic orientation of the second SOI semiconductor layer 214 may be (100), (111), or (110), so long as the crystallographic orientation of the second SOI semiconductor layer 214 differs from the crystallographic orientation of the first SOI semiconductor layer 212. In addition, the second SOI semiconductor layer 214 may have a (100) top surface orientation and a <100> channel direction, while the first SOI semiconductor layer 212 has a (100) or (110) top surface orientation and a <110> channel direction.

Figure 11:
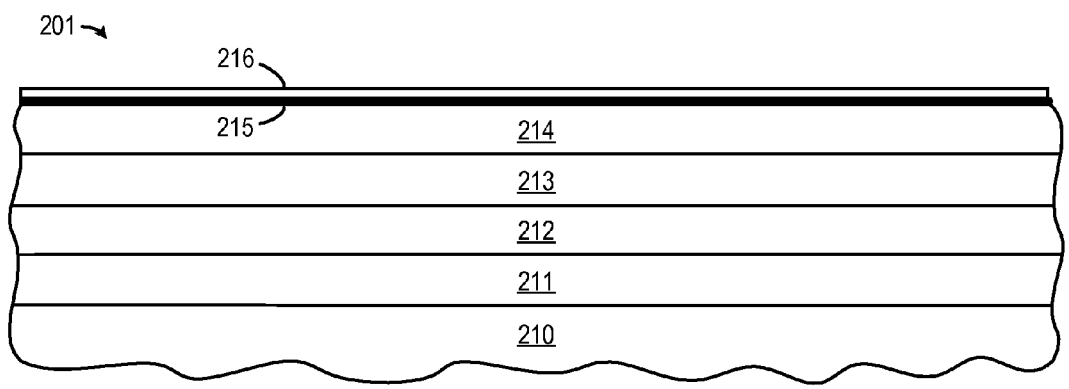
FIG. 11 is a partial cross-sectional view of a semiconductor wafer structure on which first SOI layers are formed over a substrate, second SOI layers are formed over the first SOI layers, and first oxide and nitride layers are formed over the second SOI layers.
Figure 12:
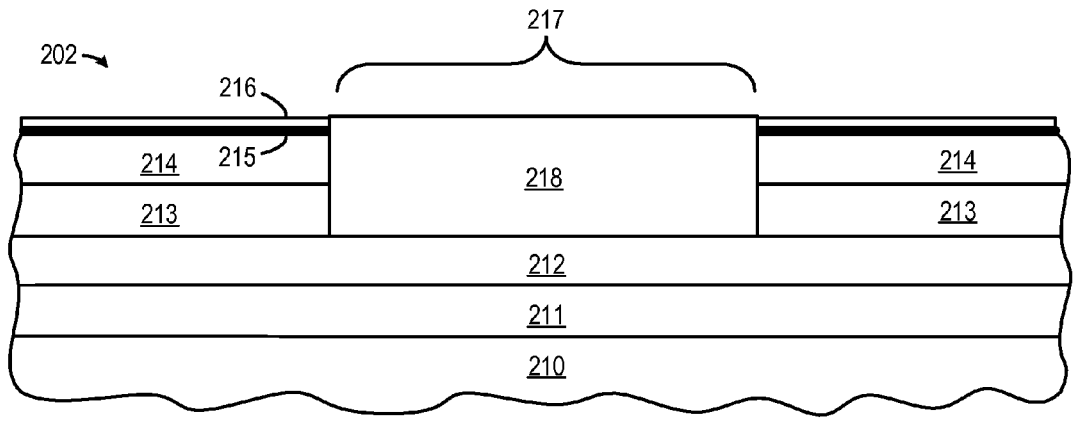
FIG. 12 illustrates processing subsequent to FIG. 11 where portions of the first nitride layer, the first oxide layer and second SOI layers have been removed and replaced with a shallow trench isolation region.

FIG. 12 illustrates processing of a semiconductor wafer structure 202 subsequent to FIG. 11 where portions of the first nitride layer 216, the first oxide layer 215, the second SOI semiconductor layer 214 and second SOI insulator layer 213 have been removed to form an opening 217 and replaced with a shallow trench isolation (STI) region 218 formed from an insulator, such as a high density plasma oxide. Any desired sequence of masking, etching, deposition and CMP polish steps (such as described above) may be used to form the STI region 218 in the opening 217.

Figure 13:
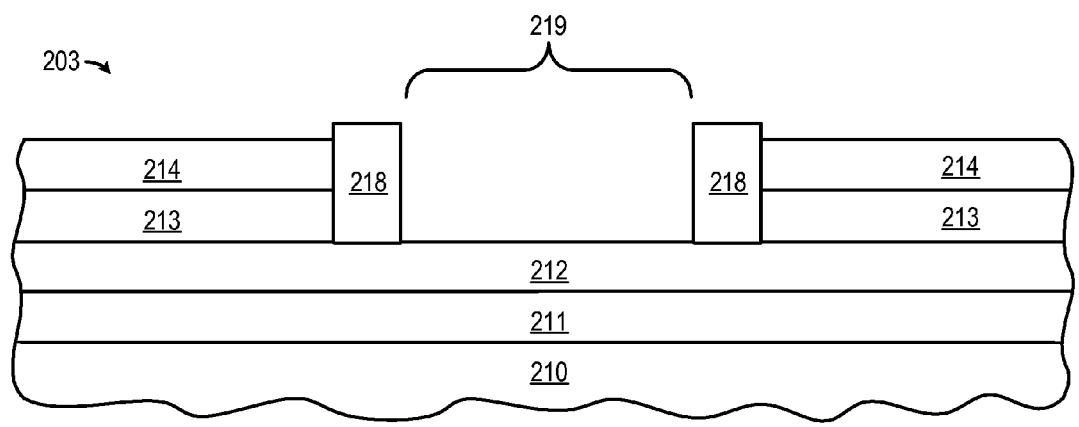
FIG. 13 illustrates processing subsequent to FIG. 12 after the first nitride layer and first oxide layer have been stripped and portions of the shallow trench isolation region have been etched or removed to form an opening down to the first SOI semiconductor layer.

FIG. 13 illustrates processing of a semiconductor wafer structure 203 subsequent to FIG. 12 after the first nitride layer 216 and first oxide layer 215 have been stripped, and portions of the shallow trench isolation region 218 have been etched or removed to form an opening 219 down to the first SOI semiconductor layer 212. Any desired sequence of mask and etch steps (such as described above) may be used to form the opening 219 in the STI region 218 so that it is smaller than and contained within the width of the first etch opening 217.

Figure 14:
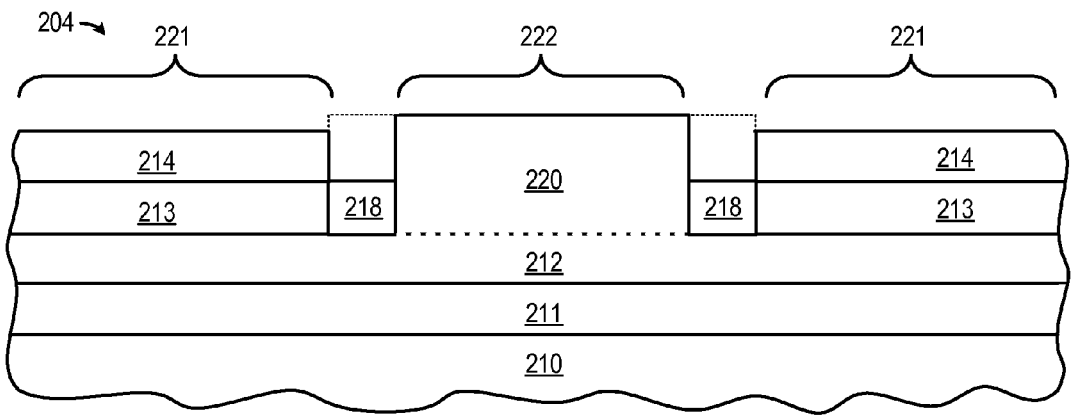
FIG. 14 illustrates processing subsequent to FIG. 13 after an epitaxial semiconductor layer is selectively formed and polished to partially or completely fill the opening prior to etching or removing at least part of the remaining shallow trench isolation region.

FIG. 14 illustrates processing of a semiconductor wafer structure 204 subsequent to FIG. 13 after an epitaxial semiconductor layer 220 is selectively formed and polished to partially or completely fill the opening 219 in the STI region 218 prior to etching or removing at least part of the remaining shallow trench isolation region 218. By filling the opening 219 with a first epitaxial layer 220 that is epitaxially grown from the first SOI semiconductor layer 212 (as indicated by the dashed line between regions 212 and 220), both layers 212, 220 will have the same crystallographic orientations. As described above, by selectively forming the first epitaxial layer 220 so that its crystallographic orientation is rotated with respect to the crystallographic orientation of the second SOI semiconductor layer 214, the mobility of the holes and electrons for subsequently formed PMOS and NMOS devices, respectively, may be optimized. The first epitaxial layer 220 is used to define and differentiate active regions for first and second types of MOS devices subsequently formed on the wafer structure 204. For example, the unetched portions of the second SOI semiconductor layer 214 define a first circuit area or device region 221 for a first type of MOS device, while the portions of the first epitaxial layer 220 defines a second circuit area or device region 222 for a second type of MOS device. To this end, at least part of the unetched portions of the STI region 218 may be used to electrically and physically isolate the first and second device regions from one another. Any desired sequence of epitaxy, CMP and etch steps (such as described above) may be used to form the epitaxial layer 220 in the STI region 218 and then etch back the remaining STI region 218 (as indicated by the dotted lines).

Figure 15:
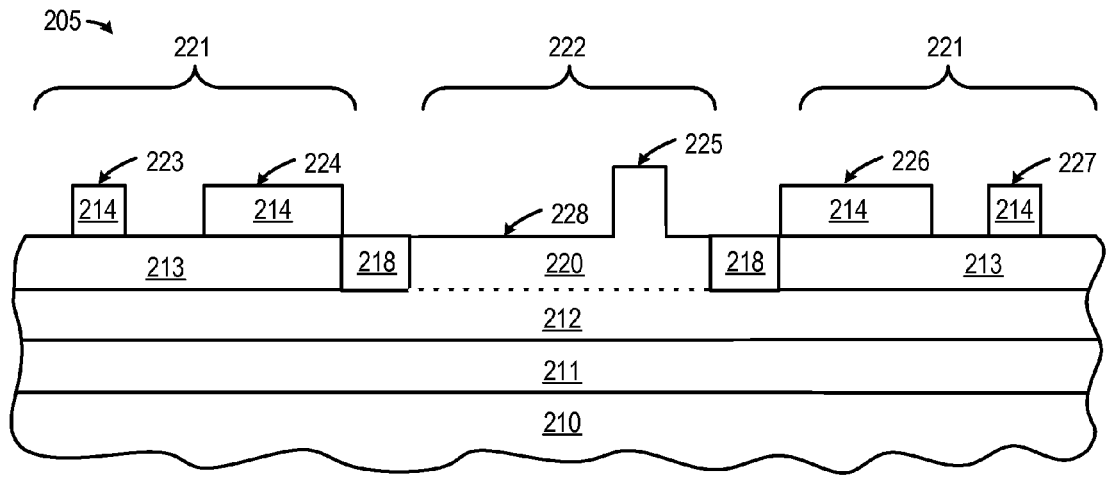
FIG. 15 illustrates processing subsequent to FIG. 14 after the second SOI semiconductor layer and epitaxial semiconductor layer are selectively etched to form the channel or body portions of FinFET transistor devices and the MOSFET substrate regions in the first and second device regions.

FIG. 15 illustrates processing of a semiconductor wafer structure 205 subsequent to FIG. 14 after the second SOI semiconductor layer 214 and epitaxial semiconductor layer 220 are selectively etched to form the channel or body portions of FinFET transistor devices 223, 225, 227 and the MOSFET substrate regions 224, 226 in the first and second device regions 221, 222. In particular, the first device region 221 includes channel or body portions of FinFET transistor devices 223, 227 that are formed from the second SOI semiconductor layer 214, and also includes substrate regions 224, 226 formed from the second SOI semiconductor layer 214. These substrate regions 224, 226 are subsequently implanted to form source/drain regions for planar MOSFET devices. In addition, the second device region 222 includes channel or body portions of FinFET transistor devices 225 that are formed from the epitaxial semiconductor layer 220, and also includes substrate region 228 formed from the etched epitaxial semiconductor layer 220 in which source/drain regions for planar MOSFET devices are subsequently implanted. As will be appreciated, any desired sequence of masking, patterning and etch steps (such as described above) may be used to form the semiconductor device features 223-228.

Figure 16:
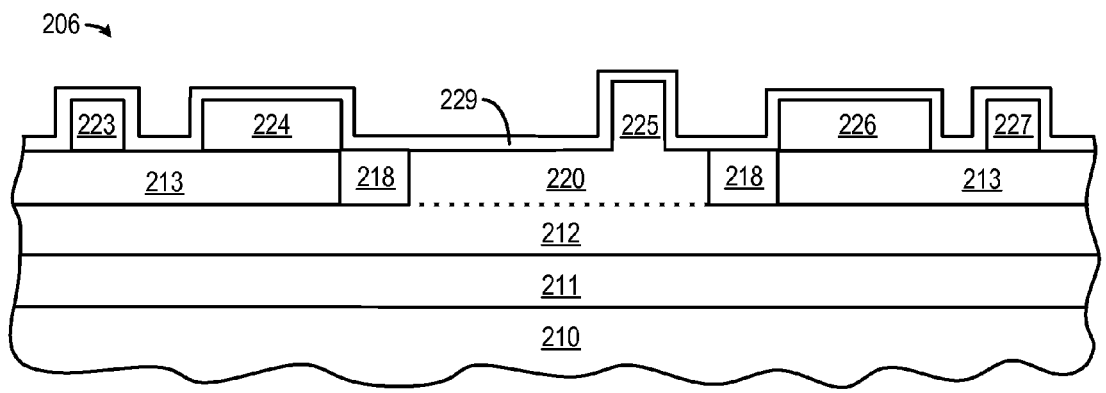
FIG. 16 illustrates processing subsequent to FIG. 15 after selective formation of an insulator layer in the first and second device regions.

FIG. 16 illustrates processing of a semiconductor wafer structure 206 subsequent to FIG. 15 after formation of an insulator layer 229 in the first and second device regions 221, 222. Any desired formation process may be used, including blanket or selective deposition or growth of a dielectric material, such as oxide or nitride.

Figure 17:
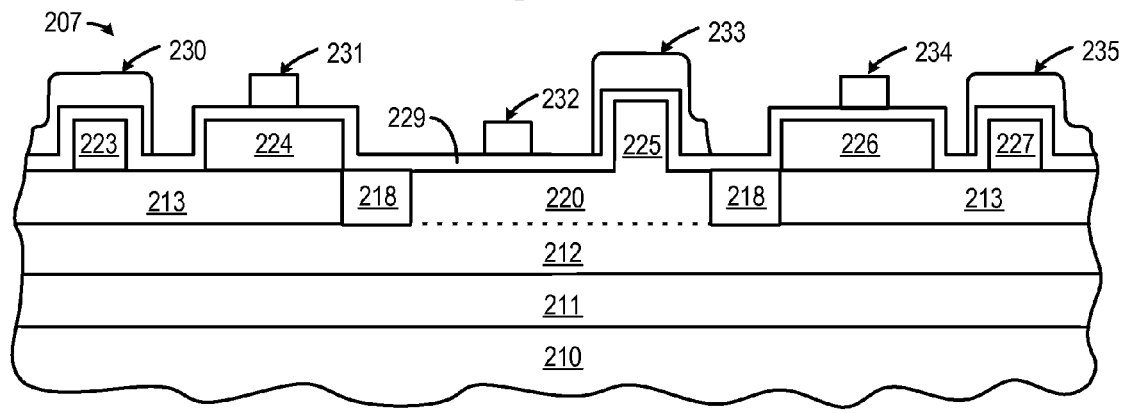
FIG. 17 illustrates processing subsequent to FIG. 16 after a conductive gate layer is deposited and selectively etched to form gate electrodes for FinFET transistor devices and for planar MOSFET devices.

FIG. 17 illustrates processing of a semiconductor wafer structure 207 subsequent to FIG. 16 after a conductive gate layer is deposited and selectively etched to form gate electrodes for FinFET transistor devices and planar MOSFET devices. In a selected embodiment, a conductive gate layer (e.g., doped polysilicon, doped SiGe and/or a metallic layer) is deposited over the wafer structure 207 so that it covers the insulator layer 229 which covers the top and sides of the body portions 223, 225, 227 of FinFET transistor devices and the substrate regions 224, 226, 228. The conductive layer is then patterned and etched to form gate electrodes 230, 233, 235 for the FinFET transistor devices. With the same etch process, the gate electrodes 231, 232, 234 are formed for the planar MOSFET transistor devices.

It will be appreciated that additional processing steps will be used to complete the fabrication of the CMOS FinFET and planar MOSFET transistor devices. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

In one form there is provided herein a method for fabricating a dual substrate semiconductor structure by forming a second semiconductor layer over a first semiconductor layer, where the first and second semiconductor layers are isolated from one another by an insulator layer and where the first and second semiconductor layers have different crystal orientations. In various embodiments, the first semiconductor layer has a crystal orientation (e.g., n-type silicon having a (110) or (100) surface orientation and a <110> channel direction) that is rotated forty-five degrees with respect to the crystal orientation of the second semiconductor layer (e.g., p-type silicon having a (100) surface orientation and a <100> channel direction). Also, the first semiconductor layer may be formed from a silicon handle wafer layer, or may be formed over a silicon handle wafer and isolated therefrom by a buried insulator layer. After a first trench opening is formed through the second semiconductor layer that exposes the first semiconductor layer in a first area, the first trench opening is filled with an insulating material to form a shallow trench isolation region. A second trench opening is subsequently formed in the shallow trench isolation region that exposes the first semiconductor layer in a second area contained within the first area, thereby leaving unetched portions of the shallow trench isolation region. In the second trench opening, a first epitaxial semiconductor material is epitaxially grown from an exposed surface of the first semiconductor layer to form a first epitaxial semiconductor layer which may be patterned and etched, along with the second semiconductor layer, to form one or more FinFET channel regions and/or planar MOSFET channel regions. In addition, a gate layer may be formed over the FinFET channel regions to cover a top surface and most of a side surface of the FinFET channel regions, and then selectively etched to form one or more gate electrodes over the FinFET channel regions.

In another form, there is provided method for forming a semiconductor structure having dual substrates on a wafer. In the method, a second semiconductor layer (e.g., an SOI semiconductor layer) is formed over at least part of a first semiconductor layer (e.g., a bulk semiconductor substrate layer or an SOI semiconductor layer) so that they are electrically isolated and so that the second semiconductor layer has a crystal orientation that is rotated 45 degrees with respect to the crystal orientation of the first semiconductor layer. In various embodiments, the first semiconductor layer has a crystal orientation (e.g., n-type silicon having a (110) or (100) surface orientation and a <110> channel direction) that is rotated forty-five degrees with respect to the crystal orientation of the second semiconductor layer (e.g., p-type silicon having a (100) surface orientation and a <100> channel direction). After removing the second semiconductor layer in a first region to form a first trench opening, a first insulator layer is formed in the first trench opening. Subsequently, a second trench opening is formed in the first insulator layer by removing the first insulator layer in a second region within the first region to expose the first semiconductor layer. After the second trench opening is filled by epitaxially growing a first epitaxial semiconductor layer on an exposed surface of the first semiconductor layer, the first epitaxial semiconductor layer and the second semiconductor layer are selectively etched to form FinFET channel regions (and planar channel regions) from the first epitaxial semiconductor layer and the second semiconductor layer. By forming, in sequence, a second insulator layer and a conductive gate layer over the FinFET channel regions (and the planar channel regions), the conductive gate layer may be selectively etched to form FinFET gate electrodes (and MOSFET gate electrodes).

In yet another form, there is provided a method for fabricating FET devices on a twisted dual substrates. First, a wafer is provided having a second semiconductor layer that is isolated from an underlying first semiconductor layer by at least a buried insulator layer, where the second semiconductor layer is crystallographically rotated with respect to the underlying first semiconductor layer. In various embodiments, the first semiconductor layer has a crystal orientation (e.g., n-type silicon having a (110) or (100) surface orientation and a <110> channel direction) that is rotated forty-five degrees with respect to the crystal orientation of the second semiconductor layer (e.g., p-type silicon having a (100) surface orientation and a <100> channel direction). Once an area in the first semiconductor layer is exposed, a first epitaxial semiconductor layer is epitaxially grown from the exposed area so that the first epitaxial semiconductor layer is isolated from the second semiconductor layer by at least a shallow trench isolation region. By selectively etching the first epitaxial semiconductor layer and the second semiconductor layer, CMOS FinFET channel regions and planar channel regions are formed from the first epitaxial semiconductor layer and the second semiconductor layer. On these channel regions, an insulator layer is formed, followed by formation of a conductive gate layer over the insulator layer. By selectively etching the conductive gate layer, FinFET gate electrodes and MOSFET gate electrodes are formed.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the thickness of the described layers may deviate from the disclosed thickness values, as may the specific sequence of semiconductor processing steps used to form the various features. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. For example, the disclosed semiconductor manufacturing processes provide for efficient layout and fabrication of CMOS FinFET and planar devices with improved device performance that exploits the differing surface orientation dependencies of holes and electrons. In accordance with selected embodiments, bulk and SOI techniques are used to fabricate CMOS FinFET and planar MOSFET transistor devices formed on dual substrates which are optimally twisted or rotated with respect to one another. In other embodiments, CMOS FinFET and planar MOSFET transistor devices are both manufactured using fully SOI techniques which provide optimum channel surface orientation for each type of transistor device. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a dual substrate semiconductor structure, comprising:

forming a first semiconductor layer having a first crystal orientation;

forming a second semiconductor layer over at least part of the first semiconductor layer, wherein the second semiconductor layer is electrically isolated from the first semiconductor layer and has a second crystal orientation that is different from the first crystal orientation;

forming a shallow trench isolation region in a first trench opening that exposes the first semiconductor layer in a first area by filling the first trench opening with an insulating material; then forming a second trench opening in the shallow trench isolation region that exposes the first semiconductor layer in a second area contained within the first area; then epitaxially growing a first epitaxial semiconductor material on at least an exposed surface of the first semiconductor layer to form a first epitaxial semiconductor layer; and patterning and etching the first epitaxial semiconductor layer and the second semiconductor layer to form one or more FinFET channel regions.

2. The method of claim 1, where the first crystal orientation is rotated forty-five degrees with respect to the second crystal orientation.

3. The method of claim 1, where the first semiconductor layer has a (110) surface orientation, and the second semiconductor layer has a (100) surface orientation.

4. The method of claim 1, wherein the second semiconductor layer comprises (100) p-type silicon and the first epitaxial semiconductor layer comprises (110) n-type silicon.

5. The method of claim 1, where the first semiconductor layer comprises a silicon handle wafer.

6. The method of claim 1, where the first semiconductor layer is formed over a buried insulator layer that is formed on a silicon handle wafer layer.

7. The method of claim 1, where patterning and etching the first epitaxial semiconductor layer and the second semiconductor layer also form one or more planar MOSFET channel regions.

8. The method of claim 1, further comprising:
forming a gate layer over the FinFET channel regions, and
selectively etching the gate layer to form one or more gate electrodes over the FinFET channel regions.

9. A method for forming a semiconductor structure having dual substrates on a wafer, comprising:
forming a first semiconductor layer having a first crystal orientation;
forming a second semiconductor layer over at least part of the first semiconductor layer, wherein the second semiconductor layer is electrically isolated from the first semiconductor layer by a buried insulator layer and where the second semiconductor layer has a crystal orientation that is rotated 45 degrees with respect to the first crystal orientation of the first semiconductor layer;
forming a first trench opening that exposes the first semiconductor layer by removing the buried insulator layer and the second semiconductor layer in a first region;
forming a first insulator layer to fill in the first trench opening; then
forming a second trench opening in the first insulator layer by removing at least the first insulator layer in a second region within the first region to expose the first semiconductor layer; then
filling at least part of a second trench opening that exposes the first semiconductor layer by epitaxially growing a first epitaxial semiconductor layer on at least an exposed surface of the first semiconductor layer; and
selectively etching the first epitaxial semiconductor layer and the second semiconductor layer to form FinFET channel regions from the first epitaxial semiconductor layer and the second semiconductor layer.

10. The method of claim 9, where the first semiconductor layer comprises a bulk semiconductor substrate layer and the second semiconductor layer comprises an SOI semiconductor layer.

11. The method of claim 9, where the first semiconductor layer comprises an SOI semiconductor layer and the second semiconductor layer comprises an SOI semiconductor layer.

12. The method of claim 9, further comprising:
forming a second insulator layer over the FinFET channel regions;
forming a conductive gate layer over the second insulator layer; and
selectively etching the conductive gate layer to form FinFET gate electrodes.

13. The method of claim 9, where the step of selectively etching the first epitaxial semiconductor layer and the second semiconductor layer is also used to form planar channel regions from the first epitaxial semiconductor layer and the second semiconductor layer.

14. The method of claim 13, further comprising:
forming a second insulator layer over the FinFET channel regions and the planar channel regions;
forming a conductive gate layer over the second insulator layer; and
selectively etching the conductive gate layer to form FinFET gate electrodes over the FinFET channel regions and to form MOSFET gate electrodes over the planar channel regions.

15. The method of claim 9, where the first semiconductor layer has a (110) surface orientation, and the second semiconductor layer has a (100) surface orientation.

16. A method for fabricating FET devices on a twisted dual substrate, comprising:
providing a second semiconductor layer that is isolated from an underlying first semiconductor layer by at least a buried insulator layer, where the second semiconductor layer is crystallographically rotated with respect to the underlying first semiconductor layer;
forming a shallow trench isolation region in a first trench opening that exposes the first semiconductor layer in a first area by filling the first trench opening with an insulating material; then
exposing the first semiconductor layer by forming a second trench opening in the shallow trench isolation region in a second area contained within the first area; then
epitaxially growing a first epitaxial semiconductor layer from the second area, where the first epitaxial semiconductor layer is isolated from the second semiconductor layer by the shallow trench isolation region;
selectively etching the first epitaxial semiconductor layer to form first CMOS FinFET channel regions and planar channel regions from the first epitaxial semiconductor layer; and
selectively etching the second semiconductor layer to form second CMOS FinFET channel regions and planar channel regions from the second semiconductor layer.

17. The method of claim 16, further comprising:
forming an insulator layer over the CMOS FinFET channel regions and planar channel regions;
forming a conductive gate layer over the insulator layer; and
selectively etching the conductive gate layer to form FinFET gate electrodes and MOSFET gate electrodes.

18. The method of claim 16, where the second semiconductor layer is crystallographically rotated forty-five degrees with respect to the underlying first semiconductor layer.

19. The method of claim 16, wherein the second semiconductor layer comprises (100) p-type silicon and the first epitaxial semiconductor layer comprises (110) n-type silicon.

* * * * *